(12) United States Patent
Lee et al.

(10) Patent No.: US 7,539,927 B2
(45) Date of Patent: May 26, 2009

(54) HIGH SPEED HARDWARE IMPLEMENTATION OF MODIFIED REED-SOLOMON DECODER

(75) Inventors: Shuenn-Gi Lee, Hsinchu (TW); Shin-Lin Shieh, Chin-Men (TW); Wern-Ho Sheen, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 476 days.

(21) Appl. No.: 11/105,420

(22) Filed: Apr. 14, 2005

(65) Prior Publication Data

US 2006/0236212 A1    Oct. 19, 2006

(51) Int. Cl.
*H03M 13/15* (2006.01)
(52) U.S. Cl. .................................... 714/784
(58) Field of Classification Search ........ 714/759, 714/774, 784
See application file for complete search history.

(56) References Cited

U.S. PATENT DOCUMENTS

| | | | | |
|---|---|---|---|---|
| 5,068,858 A | * | 11/1991 | Blaum et al. | 714/774 |
| 5,297,153 A | * | 3/1994 | Baggen et al. | 714/782 |
| 5,541,937 A | * | 7/1996 | Iwamura | 714/785 |
| 5,805,616 A | * | 9/1998 | Oh | 714/784 |
| 6,119,262 A | * | 9/2000 | Chang et al. | 714/781 |
| 6,347,389 B1 | * | 2/2002 | Boyer | 714/784 |
| 6,449,746 B1 | * | 9/2002 | Truong et al. | 714/784 |
| 7,096,409 B2 | * | 8/2006 | Banks | 714/784 |

OTHER PUBLICATIONS

H.C. Chang et al., "An area-efficient architecture for Reed-Solomon decoder using the inversionless decomposed Euclidean algorithm," *IEEE International Symposium on Circuits and Systems*, vol. 2, pp. 659-652, May 2001.
H. Lee, "High-Speed VLSI Architecture for Parallel Reed-Solomon Decoder," *IEEE Transactions on Very Large Scale Integration (VLSI) Systems*, vol. II, No. 2, pp. 288-294, Apr. 2003.
IEEE P802.16a-2003, "Air Interface for Fixed Broadband Wireless Access Systems Part A: Systems between 2-11 GHz;" Apr. 2003.
S. B. Wicker et al., *Reed-Solomon Codes and Their Applications*. Piscataway, NJ: IEEE Press, 1994, chapter 5, pp. 60-107.
S.B. Wicker, *Error Control Systems for Digital Communication and Storage*. Englewood Cliffs, NJ: Prentice Hall, 1995, chapter 9, pp. 203-237.

* cited by examiner

*Primary Examiner*—Stephen M Baker
(74) *Attorney, Agent, or Firm*—Finnegan, Henderson, Farabow, Garrett & Dunner LLP

(57) ABSTRACT

A decoder suitable for use in a digital communications system utilizing an RS(n', k') code modified from an RS(n, k) code receives n'-symbol vectors each including k' message symbols and r'=n'-k' parity symbols and decodes the n'-symbol vectors to correct errors therein, wherein n, k, n', and k' are integers, and k'<n'<n, k'<k<n, and wherein the decoder stores therein one erasure locator polynomial $\sigma_0(x)$. The decoder includes a syndrome calculator for receiving the n'-symbol vectors and for calculating syndromes of each n'-symbol vector, wherein the i-th syndrome $S_i$ of one n'-symbol vector R', $(r_{n'-1}, r_{n'-2}, \ldots, r_0)$, is $S_i = R_s(\alpha^{i+1})$ for $i=0, 1, \ldots, n-k-1$, wherein $R_s(x) = r_{n'-1}x^{n'-1} + r_{n'-2}x^{n'-2} + \ldots + r_0$, and means for finding the locations and values of the errors in each n'-symbol vector using the syndromes thereof and the one erasure locator polynomial $\sigma_0(x)$.

27 Claims, 14 Drawing Sheets

$(n-1) \ldots \ldots \ldots (n-k+1) \; (n-k) \quad (n-k-1) \ldots \ldots \ldots 0$

| $k$ message symbols | $r$ parity symbols |

Fig. 5A
Prior Art

| $(k-k')$ shortened message symbols | $k'$ message symbols | $r'$ parity symbols | $(r-r')$ punctured parity symbols |

Fig. 5B
Prior Art

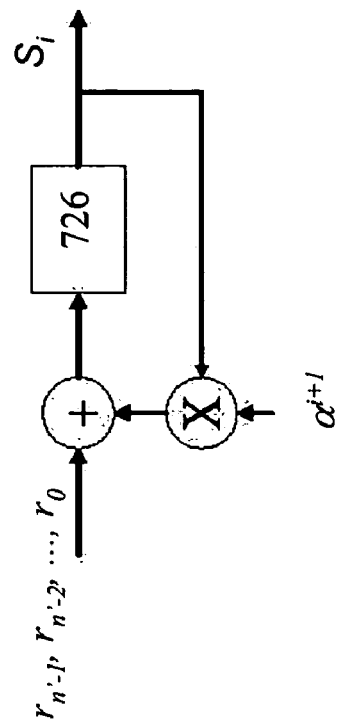
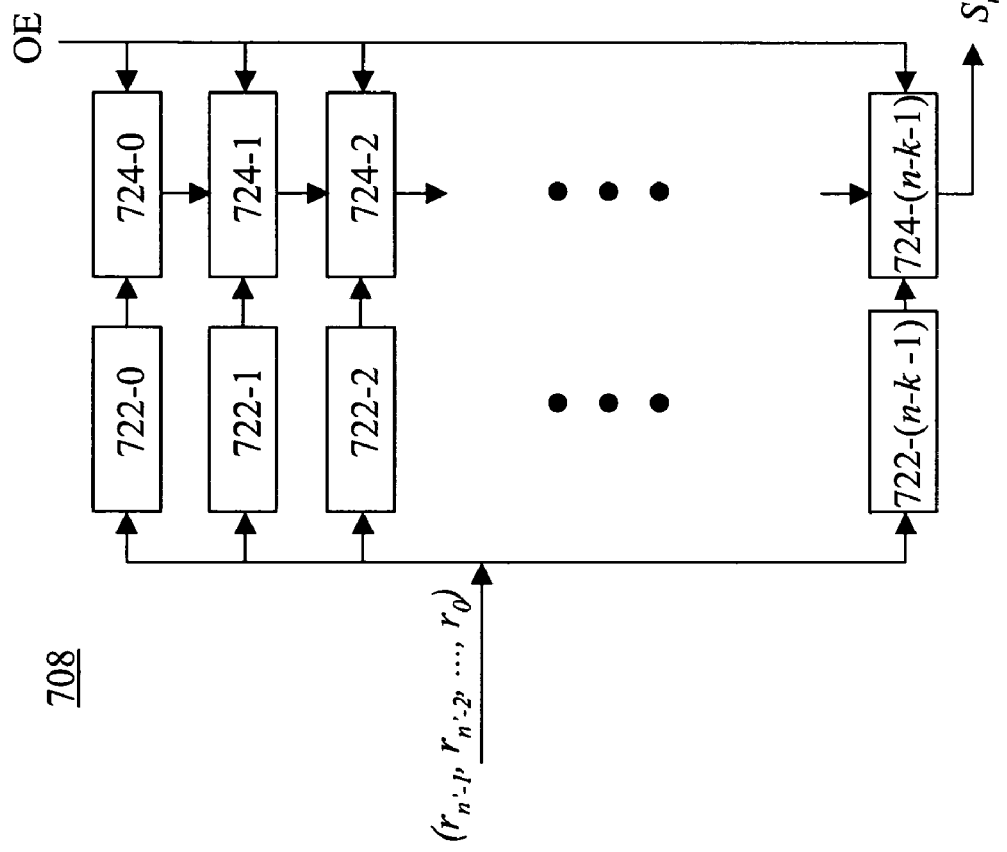
Fig. 8B
Fig. 8A

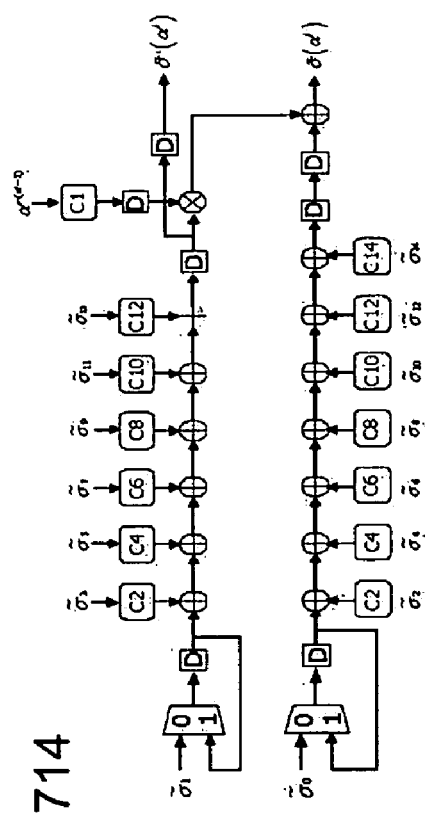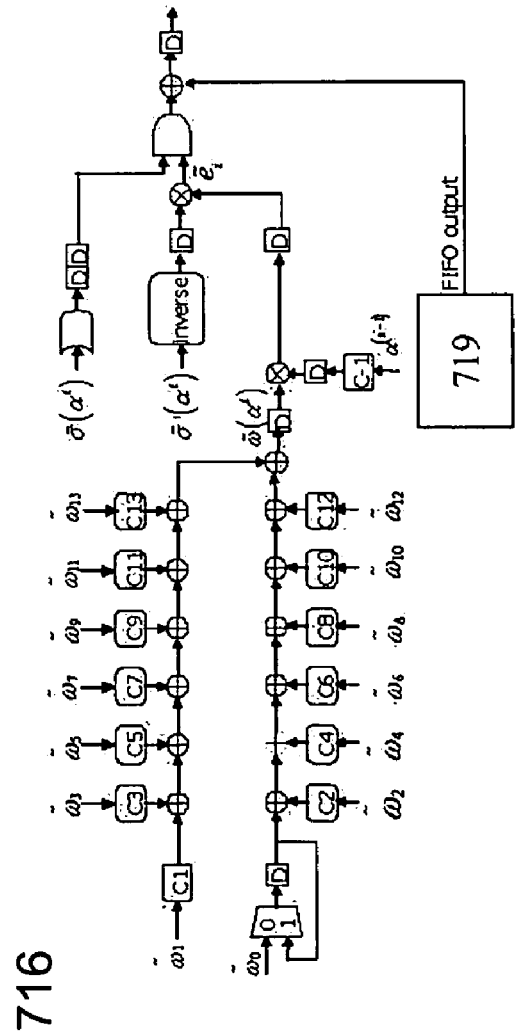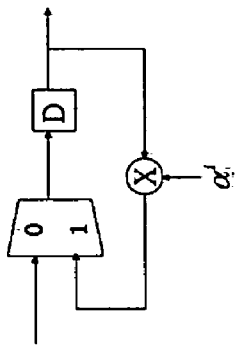
Fig. 13A
Fig. 13B
Fig. 13C

HIGH SPEED HARDWARE IMPLEMENTATION OF MODIFIED REED-SOLOMON DECODER

FIELD OF THE INVENTION

This invention is in general related to a high speed Reed-Solomon (RS) decoder suitable for decoding shortened/punctured RS codes.

BACKGROUND OF THE INVENTION

A digital communications system includes an encoder (or transmitter) for encoding and transmitting data, a decoder (or receiver) for receiving and decoding data, and a channel between the encoder and decoder. The channel is generally noisy and causes corruption in the data transmitted therethrough. For the correct data to be recovered, an error-correction code is used during encoding at the encoder side and used by the decoder to correct the corruption in the data. One popular type of such error-correction code is called the Reed-Solomon (RS) code. An encoder/decoder utilizing the RS code is called an RS encoder/decoder. The RS code is briefly explained next.

RS codes are nonbinary codes, i.e., the unit thereof is not a binary bit, but rather a symbol made up of multiple binary bits. For example, in an 8-bit-byte system, each symbol (or byte) contains 8 binary bits and an RS code contains a number of symbols. In the following description, it is assumed that each symbol is composed of m binary bits, where m is an integer. A symbol containing m bits, $a_{m-1}, a_{m-2}, \ldots, a_0$, may be represented by an (m−1)-degree polynomial, $K(x)=a_{m-1}x^{m-1}+a_{m-2}x^{m-2}+\ldots+a_0$, where x is the indeterminate. Thus, the collection of all $2^m$ possible m-bit symbols constitute a set $\{K(x)=a_{m-1}x^{m-1}+a_{m-2}x^{m-2}+\ldots+a_0\}$, where $a_i \in \{0,1\}$ for $i=0, 1, \ldots, m-1$.

Set $\{K(x)\}$, coupled with an addition operator (+) and a multiplication operator (×) defined thereupon, defines a finite field, or Galois field, which may be denoted as $GF(2^m)$. Particularly, the addition of the elements of $GF(2^m)$ (or elements of $\{K(x)\}$) is defined as a binary addition of the corresponding polynomials, where the coefficients of the same powers in the corresponding polynomials are added modulo 2. The modulo-2 addition is defined as a binary addition with no carry, for example, 0+1=1, and 1+1=0. When two elements of $GF(2^m)$ are multiplied, the corresponding polynomials are multiplied and reduced to a residue modulo f(x), i.e., multiples of f(x) are reduced to 0. Here f(x) is an m-degree primitive polynomial of $GF(2^m)$, which by definition is irreducible and divides $x^n+1$ when $n=2^m-1$, but does not divide $x^n+1$ when $n<2^m-1$. Thus, the addition or multiplication of two elements of $GF(2^m)$ generates a polynomial of order not greater than m−1, which corresponds to another element of $GF(2^m)$.

It is well known that $GF(2^m)$ as defined above includes a so-called primitive element α that is a root of f(x), and every element of $GF(2^m)$ except 0 is a power of α. Because f(x) divides $x^{2^m-1}+1$, there is $\alpha^{2^m-1}=1$ (note that this is equivalent to saying $\alpha^{2^m-1}+1=0$ in binary arithmetic). Thus, the elements of $GF(2^m)$ are $0, 1(=\alpha^0), \alpha^1, \ldots, \alpha^{2^m-2}$.

With each element of $GF(2^m)$ representing an m-bit symbol, a data sequence containing a sequence of symbols may be represented by a vector including a sequence of elements of $GF(2^m)$. For example, a sequence of symbols represented by n (n being an integer) elements of $GF(2^m)$, $c_{n-1}, c_{n-2}, \ldots, c_0$, form an n-degree vector C over $GF(2^m)$, $(c_{n-1}, c_{n-2}, \ldots, c_0)$. C may be further represented by a polynomial with the sequence of elements of $GF(2^m)$ as coefficients of the polynomial, i.e., $C(x)=c_{n-1}x^{n-1}+c_{n-2}x^{n-2}+\ldots+c_0$.

According to the conventional method for RS encoding, redundant symbols are added to a message block to form an RS code, where the redundant symbols and the symbols of the message block satisfy a predetermined condition. The RS code is then transmitted through a channel. A receiver receives the transmitted RS code and determines if the RS code has been corrupted by evaluating whether the received RS code still satisfies the same condition. The receiver corrects any error in the received RS code and extracts the message block therefrom.

Particularly, when a message block M containing k symbols, $m_{k-1}, m_{k-2}, \ldots, m_0$, is encoded, a parity sequence P containing a number of redundant symbols (also called parity symbols) is appended to the end of message block M to form an n-degree vector C, where $0<k<n<2^m+2$. Thus, vector C includes k message symbols of message block M, $m_{k-1}, m_{k-2}, \ldots, m_0$, followed by n−k parity symbols, $p_{n-k-1}, p_{n-k-2}, \ldots, p_0$, and may be expressed as $$C(x) = m_{k-1}x^{n-1} + m_{k-2}x^{n-2} + \ldots + m_0 x^{n-k} + \qquad (1)$$
$$p_{n-k-1}x^{n-k-1} + p_{n-k-2}x^{n-k-2} + \ldots + p_0$$
$$= x^{n-k}M(x) + P(x).$$

The encoding is carried out such that C(x) is divisible by a generator polynomial $$g(x) = \prod_{i=l}^{l+n-k-1} (x - \alpha^i), \text{ i.e.,} \qquad (2)$$

$$g(x) \mid C(x),$$

where l is called the offset and may be any integer. In the following, it is assumed that l=1 for simplicity. If C satisfies condition (2), C is called a valid codeword or a codeword. It is well known that an RS code is cyclic, meaning that if an n-symbol sequence C, $c_{n-1}, c_{n-2}, \ldots, c_0$, is a valid codeword, then when C is shifted by b symbols to generate a new sequence $C_b$, $c_{n-b-1}, c_{n-b-2}, \ldots, c_0, c_{n-1}, c_{n-2}, \ldots, c_{n-b}$, $C_b$ is also a valid codeword, where b is any integer.

After encoding, vector C is transmitted through the channel.

At the decoder side, a vector R corresponding to codeword C is received and includes $r_{n-1}, r_{n-2}, \ldots, r_0$, which may differ from the original n symbols of C, $m_{k-1}, m_{k-2}, \ldots, m_0, p_{n-k-1}, p_{n-k-2}, \ldots, p_0$, due to noise in the channel. The decoder then decodes R to recover C as follows.

First, syndromes are computed for R. Syndromes of R are defined as $S_i=R(\alpha^{i+1})$ for $i=0, 1, \ldots, n-k-1$, where R(x) is the polynomial representation of R:

$$R(x)=r_{n-1}x^{n-1}+r_{n-2}x^{n-2}+\ldots+r_0. \qquad (3)$$

From (2), if no error occurs in the received vector R, $S_i$ should be 0 for $i=0, 1, \ldots, n-k-1$, because $g(x)|(R(x)=C(x))$. However, if it is assumed there are t errors occurring at unknown locations $j_1, j_2, \ldots, j_t$, and the errors in the received symbols of R at these locations have values $e_1, e_2, \ldots, e_t$, where $e_i=r_{j_i}-c_{j_i}$, for $i=1, 2, \ldots, t$, then there is:

$$R(x)=C(x)+e(x), \qquad (4)$$

where $e(x)=e_1x^{j_1}+e_2x^{j_2}+\ldots+e_tx^{j_t}$, is the error polynomial. For convenience, error locator numbers $\beta_1, \beta_2, \ldots, \beta_t$, are defined as follows $$\beta_i=\alpha^{j_i}, \text{ for } i=1, 2, \ldots, t. \quad (5)$$

Combining (2), (4), and (5), there are:

$$S_0=e_1\beta_1+e_2\beta_2+\ldots, +e_t\beta_t,$$

$$S_1=e_1\beta_1^2+e_2\beta_2^2+\ldots+e_t\beta_t^2,$$

$$\ldots$$

$$S_{n-k-1}=e_1\beta_1^{n-k}+e_2\beta_2^{n-k}+\ldots+e_t\beta_t^{n-k}. \quad (6)$$

Because there are 2t unknowns, $e_1, e_2, \ldots, e_t, \beta_1\beta_2, \ldots, \beta_t$, and (6) has n−k equations, a solution may be found if n−k≧2t. In other words, the RS code can correct up to $\lfloor(n-k)/2\rfloor$ errors, where $\lfloor x \rfloor$ is the floor function which gives the greatest integer not greater than x.

To facilitate solving the equations in (6), an error locator polynomial $\sigma(x)$ is defined as $$\sigma(x) = \prod_{i=1}^{t}(1-\beta_i x) = \sum_{i=0}^{t}\sigma_i x^i, \quad (7)$$

an error evaluator polynomial $\omega(x)$ is defined as $$\omega(x) = \sum_{j=1}^{t} e_j\beta_j \prod_{\substack{i=1\\i\neq j}}^{t}(1-\beta_i x) = \sum_{i=0}^{t-1}\omega_i x^i, \quad (8)$$

and a syndrome polynomial S(x) is defined as $$S(x) = \sum_{i=0}^{n-k-1} S_i x^i. \quad (9)$$

From (6)-(9), there is $$S(x)\sigma(x)=\omega(x) \bmod x^{n-k}. \quad (10)$$

Equation (10) is called the key equation, and may be solved by a computer system applying a modified Euclidean (ME) algorithm to find $\sigma(x)$ and $\omega(x)$. After $\sigma(x)$ and $\omega(x)$ are determined, the location of the errors are determined by determining the roots of $\sigma(x)$, which may be carried out by performing a Chien search. The Chien search simply computes the value of $\sigma(x)$ at points $\alpha^0, \alpha^{-1}, \ldots, \alpha^{-(n-1)}$. Note that, because $\alpha^{2^m-1}=1$, evaluating $\sigma(x)$ at points $\alpha^0, \alpha^{-1}, \ldots, \alpha^{-(n-1)}$ is equivalent to evaluating $\sigma(x)$ at points $\alpha^0=\alpha^{2^m-1}, \alpha^{2^m-2}, \ldots, \alpha^{2^m-n}$. By definition of $\sigma(x)$ in (7), if an error occurs at location $j_i$, then $\sigma(\beta_i^{-1})=\sigma(\alpha^{-j_i})=0$. If $\sigma(\alpha^{-i})\neq 0$, then no error took place at location i. Also, from (7) and (8), the error values may be computed according to the following expression for a Forney algorithm:

$$e_i = \begin{cases} 0, & \text{if } \sigma(\alpha^{-i}) \neq 0 \\ \frac{\omega(\alpha^{-i})}{\sigma'(\alpha^{-i})}, & \text{if } \sigma(\alpha^{-i}) = 0 \end{cases}, \quad (11)$$

for i=1, 2, . . . , t, where $\sigma'(x)$ is the derivative of $\sigma(x)$:

$$\sigma'(x) = -\sum_{j=1}^{t} \beta_j \prod_{\substack{i=1\\i\neq j}}^{t}(1-\beta_i x). \quad (12)$$

If l≠1, there is $$e_i = \begin{cases} 0, & \text{if } \sigma(\alpha^{-i}) \neq 0 \\ \frac{-\alpha^{-i(l-1)}\omega(\alpha^{-i})}{\sigma'(\alpha^{-i})}, & \text{if } \sigma(\alpha^{-i}) = 0 \end{cases}. \quad (11\text{-}1)$$

The errors are then subtracted from R, i.e., $c_i=r_{j_i}-e_{j_i}$, for i=1, 2, . . . , t, to generate the correct codeword C.

In "High-Speed VLSI Architecture for Parallel Reed-Solomon Decoder," Hanho Lee, *IEEE Trans. on Very Large Scale Integration Systems*, v. 11, No. 2, April 2003, pp. 288-294 ("Lee"), the entire contents of which are incorporated herein by reference, an RS decoder implementing the above decoding method was proposed. The RS decoder of Lee is briefly discussed herein, with reference to the figures of Lee, which are reproduced here as FIGS. 1, 2A-2B, 3A-3B, and 4A-4C.

FIG. 1 shows a digital communications system including the RS decoder. An encoder encodes k symbols to generate an n-symbol codeword. The n-symbol codeword is transmitted through a channel and is received by the decoder. The decoder includes two parts: an error detection part and an error correction part. In the error detection part, a syndrome computation block computes the n–k syndromes. In the error correction part, a modified Euclidean (ME) algorithm block generates the error-locator polynomial $\sigma(x)$ and the error-evaluator polynomial $\omega(x)$, using the n–k syndromes. The error-locator polynomial $\sigma(x)$ and the error-evaluator polynomial $\omega(x)$ are sent to a Chien search block, which computes $\sigma(x)$ and $\sigma'(x)$ at points $\alpha^0, \alpha^1, \ldots, \alpha^{n-1}$. A Forney algorithm block then computes the error values based on $\omega(x)$ and $\sigma'(x)$. An Error correction block finally corrects the received vector R using the error locations and the error values.

FIGS. 2A-2B, 3A-3B, and 4A-4C show the detailed logic diagrams of the decoder. FIGS. 2A and 2B show the logic diagrams of the syndrome computation block where FIG. 2A shows a syndrome calculation cell and FIG. 2B shows a total of 16 syndrome cells of FIG. 2A connected in series for calculating 16 syndromes (n–k=16). As shown in FIG. 2A, the n symbols of R are input into each syndrome calculation cell for calculating the corresponding syndrome. As shown in FIG. 2B, the 16 syndromes are output serially.

FIGS. 3A and 3B show the logic diagrams of the ME algorithm block, where FIG. 3A shows an ME processing element (PE) and FIG. 3B shows 16 ME PE's, PE1, PE2, . . . , PE16, connected in series for calculating $\sigma(x)$ and $\omega(x)$. The ME algorithm applied in Lee is summarized as follows:

1. First, let $R_0(x)=x^{n-k}$, $Q_0(x)=S(x)$, $L_0(x)=0$, $U_0(x)=1$
2. Repeat the calculation of $R_i(x)$, $Q_i(x)$, $L_i(x)$, $U_i(x)$, i being the index starting from 1, where for each i-th iteration, $$R_i(x)=[\overline{\lambda}_{i-1}b_{i-1}R_{i-1}(x)+ \overline{\lambda}_{i-1}a_{i-1}Q_{i-1}(x)]-x^{|l_{i-1}|}[\lambda_{i-1}a_{i-1}Q_{i-1}(x)+ \overline{\lambda}_{i-1}b_{i-1}R_{i-1}(x)],$$

$$Q_i(x)=\lambda_{i-1}Q_{i-1}(x)+\overline{\lambda}_{i-1}R_{i-1}(x),$$

$$L_i(x)=[\overline{\lambda}_{i-1}b_{i-1}L_{i-1}(x)+ \overline{\lambda}_{i-1}a_{i-1}U_{i-1}(x)]-x^{|l_{i-1}|}[\lambda_{i-1}a_{i-1}U_{i-1}(x)+ \overline{\lambda}_{i-1}b_{i-1}L_{i-1}(x)],$$

$$U_i(x)=\lambda_{i-1}U_{i-1}(x)+\overline{\lambda}_{i-1}L_{i-1}(x),$$

where $a_{i-1}$, and $b_{i-1}$ are the leading coefficients of $R_{i-1}(x)$ and $Q_{i-1}(x)$, respectively, and $$l_{i-1} = deg(R_{i-1}(x)) - deg(Q_{i-1}(x)),$$

and $$\lambda_{i-1} = \begin{cases} 1, & \text{if } l_{i-1} \geq 0 \\ 0, & \text{if } l_{i-1} < 0 \end{cases}.$$

The reiteration of step 2 stops when $deg(R_i(x)) < \lfloor (n-k)/2 \rfloor$;
3. $\omega(x)=R_i(x)$, and $\sigma(x)=L_i(x)$.

FIG. 3A shows that the ME PE includes two parts, a degree computation (DC) block and a polynomial arithmetic (PA) block. The DC block computes the degrees of $R_i(x)$ and $Q_i(x)$ and also calculates $\lambda_i$. The PA block calculates $R_i(x)$, $Q_i(x)$, $L_i(x)$, $U_i(x)$.

When $\sigma(x)$ is determined, the coefficients thereof, $\sigma_0$, $\sigma_1$, ..., $\sigma_t$, are sent to the Chien search block for evaluating $\sigma(x)$ and $\sigma'(x)$ for $x=\alpha^0, \alpha^1, \ldots, \alpha^{n-1}$, as shown in FIG. 4A. Because in binary arithmetic, $A(x)+A(x)=0$, there is $x\sigma'(x)=\sigma_{odd}(x)$. Thus, as shown in FIG. 4A, $\sigma'(x)$ may be calculated at the same time $\sigma(x)$ is calculated. The Chien search cells, labeled as $C_i$ in FIG. 4A, compute the i-th term in $\sigma(x)$ or $\sigma'(x)$, and the result of all the Chien search cells are summed up to generate $\sigma(x)$ and $\sigma'(x)$. FIG. 4B shows the detail of the i-th Chien search cell. The Chien search block outputs in series $\sigma(\alpha^0)$, $\sigma(\alpha^1)$, ..., $\sigma(\alpha^{n-1})$.

Similarly, the coefficients of $\omega(x)$, $\omega_0$, $\omega_1$, ..., $\omega_{t-1}$, are sent to the Forney algorithm block, as shown in FIG. 4C, for the calculation of $\omega(x)$ for $x=\alpha^0, \alpha^1, \ldots, \alpha^{n-1}$. The Forney algorithm block of FIG. 4C also computes the error values according to expression (11), based on the results of $\sigma(x)$, $\sigma'(x)$, and $\omega(x)$. The error values are then added to the received n symbols of R to generate the correct codeword C.

An RS code that encodes k-symbol message blocks and generates n-symbol codewords, where $0<k<n<2^m+2$, is referred to as an RS(n, k) code. An RS(n, k) code includes $r=n-k$ parity symbols in each codeword. Generally, $n=2^m-1$. For example, in an 8-bit-symbol system, a standard RS code (also called a mother RS code), RS(255, 239), encodes 239-symbol message blocks into 255-symbol codewords.

In order to offer different coding rates, RS(n, k) codes are frequently modified to generate RS(n', k') codes for encoding and decoding k'-symbol message blocks, where $n'<n$, $k'<k$, and $k'<n'$, through shortening and puncturing. FIGS. 5A-5B illustrate the shortening and puncturing of an RS(n, k) code into an RS(n', k') code. The shortening of the code is carried out by setting k–k' symbols ("shortened symbols") in each codeword to be predetermined symbols, such as 0's. An encoder treats the k' symbols of a message block and the predetermined k–k' symbols as a k-symbol message block and generates r parity symbols. The puncturing of the code is then carried out by erasing/puncturing s symbols of the n–k parity symbols, where $s=r-r'=(n-k)-(n'-k')$. The k–k' shortened symbols and s punctured parity symbols are not transmitted. Thus, only n' symbols are transmitted for each codeword, including k' message symbols and r' parity symbols.

When a shortened/punctured vector R' including n' symbols, $r_{n'-1}, r_{n'-2}, \ldots, r_0$, is received, the decoder reconstructs a corresponding n-symbol vector R, by adding the shortened k–k' symbols and the punctured s parity symbols to the n' symbols of R'. The values and positions of the shortened symbols are known. The values of the punctured s parity symbols are unknown; however, their positions are predetermined and known to the decoder. The positions of the shortened and erased symbols may be randomly chosen. However, generally the first k–k' symbols of each codeword are chosen for shortening and the last s parity symbols are chosen for puncturing, as shown in FIGS. 5A and 5B. Also, for convenience and simplicity, the shortened symbols are 0's and the decoder assumes the erased symbols also to be 0's. Thus, the reconstructed vector R includes n symbols, $0, 0, \ldots, 0, r_{n'-1}, r_{n'-2}, \ldots, r_0, 0, 0, \ldots, 0$, where there are k–k' 0's before $r_{n'-1}$, and s 0's after $r_0$. The decoder then decodes R to find the error/erasure values therein to generate the correct codeword, as discussed below.

When both erasures and errors are present, the decoding process discussed above must also address the erasures. First, when R is reconstructed, syndromes may be calculated using the syndrome computation block of FIGS. 2A-2B: $S_i=R_s(\alpha^{i+1})$ for $i=0, 1, \ldots, n-k-1$, where $R(x)=r_{n'-1}x^{s+n'-1}+r_{n'-2}x^{s+n'-2}+\ldots+r_0x^s$. Assuming vector R includes t errors at positions $j_1, j_2, \ldots, j_t$, and s erasures at positions $j_{t+1}, j_{t+2}, \ldots, j_{t+s}$, and the error/erasure values $e_1, e_2, \ldots, e_{t+s}$ then $e(x)=e_1x^{j_1}+e_2x^{j_2}+\ldots+e_{t+s}x^{j_{t+s}}$ is the error/erasure polynomial, where $e_i=r_{j_i}-c_{j_i}$, for $i=1, 2, \ldots, t$, and, $e_i=c_{j_i}$, for $i=t+1, t+2, \ldots, t+s$. Let $\beta_i=\alpha^{j_i}$, for $i=1, 2, \ldots, t+s$, then $$S_0=e_1\beta_1+e_2\beta_2+\ldots+e_{t+s}\beta_{t+s},$$

$$S_1=e_1\beta_1^2+e_2\beta_2^2+\ldots+e_{t+s}\beta_{t+s}^2,$$

...

$$S_{n-k-1}=e_1\beta_1^{n-k}+e_2\beta_2^{n-k}+\ldots+e_{t+s}\beta_{t+s}^{n-k}. \quad (13)$$

Because the locations of the erasures are known, $\beta_{t-1}, \beta_{t-s}, \ldots, \beta_{t-s}$ are known parameters and may be computed before the decoding process starts. Particularly, in the example above, the last r–r' parity symbols are erased; therefore, $j_{t+1}=r-r'-1, j_{t+2}=r-r'-2, \ldots, j_{t+s}$, and $s=r-r'$. There are n–k equations in (13) containing 2t+s unknowns. Thus, equations (13) have a solution if $n-k \geq 2t+s$. In other words, an RS(n', k') code is capable of correcting t errors and s erasures, provided that $n-k \geq 2t+s$.

The error/erasure locator polynomial $\sigma(x)$ is defined as $$\sigma(x) = \sigma_0 = (x)\sigma_1(x) = \sum_{i=0}^{t+s} \sigma_i x^i, \quad (14)$$

where $$\sigma_0(x) = \prod_{i=t+1}^{t+s} (1 - \beta_i x) \quad (5)$$

is the erasure locator polynomial, which may be computed before the decoding process, and $$\sigma_1(x) = \prod_{i=1}^{t} (1 - \beta_i x)$$

is the error locator polynomial. The error/erasure evaluator polynomial $\omega(x)$ is defined as $$\omega(x) = \sum_{j=1}^{t+s} e_j \beta_j \prod_{\substack{i=1 \\ i \neq j}}^{t+s} (\beta_i x - 1) = \sum_{i=0}^{t+s-1} \omega_i x^i. \quad (15)$$

From (9) and (13)-(15), there is $$S(x)\sigma(x) = \omega(x) \bmod x^{n-k}, \quad (16)$$

or $$S(x)\sigma_0(x)\sigma_1(x) = \omega(x) \bmod x^{n-k}. \quad (17)$$

A modified syndrome polynomial $S_0(x)$ may be defined as:

$$S_0(x) = S(x)\sigma_0(x). \quad (18)$$

After the syndromes $S_i$ are calculated, the modified syndrome polynomial $S_0(x)$ may be calculated according to Expression (18). The key equation is modified as follows:

$$S_0(x)\sigma_1(x) = \omega(x) \bmod x^{n-k}. \quad (19)$$

The modified key equation may then be solve according to the ME algorithm using the ME algorithm block of FIGS. 3A and 3B, generating the error locator polynomial $\sigma_1(x)$ and error/erasure evaluator polynomial $\omega(x)$. Then, the error/erasure locator polynomial $\sigma(x)$ is calculated according to equation (14), and a Chien search and Forney algorithm (expression (11) above) are performed to find the locations of the errors and the values of the errors and erasures, which are used to recover the correct codeword.

TABLE 1

| Rate ID | Modulation | RS(n', k') |
|---------|-----------|-----------|
| 0 | QPSK | (32, 24) |
| 1 | QPSK | (40, 36) |
| 2 | 16QAM | (64, 48) |
| 3 | 16QAM | (80, 72) |
| 4 | 64QAM | (108, 96) |
| 5 | 64QAM | (120, 108) |

The IEEE 802.16a standard provides six standard shortened/punctured RS codes of a mother code RS(255, 239), as shown in Table 1. The first column, Rate ID, is for identification purposes. The second column shows the modulation schemes, where QPSK stands for quadrature phase shift keying, and QAM stands for quadrature amplitude modulation. The third column shows the resultant RS(n', k') codes.

SUMMARY OF THE INVENTION

Consistent with embodiments of the present invention, there is provided a decoder suitable for use in a digital communications system utilizing an RS(n', k') code modified from an RS(n, k) code receives n'-symbol vectors each including k' message symbols and r'=n'-k' parity symbols and decodes the n'-symbol vectors to correct errors therein, wherein n, k, n', and k' are integers, and k'<n'<n, k'<k<n, and wherein the decoder stores one erasure locator polynomial $\sigma_0(x)$. The decoder includes a syndrome calculator for receiving the n'-symbol vectors and for calculating syndromes of each n'-symbol vector, wherein the i-th syndrome $S_i$ of one n'-symbol vector R', $(r_{n'-1}, r_{n'-2}, \ldots, r_0)$, is $S_i = R_s(\alpha^{i+1})$ for i=0, 1, ..., n−k−1, wherein $R_s(x) = r_{n'-1} x^{n'-1} + r_{n'-2} x^{n'-2} + \ldots + r_0$, and means for finding the locations and values of the errors in each n'-symbol vector using the syndromes thereof and the one erasure locator polynomial $\sigma_0(x)$.

Consistent with embodiments of the present invention, there is also provided a digital communications system utilizing an RS(n', k') code modified from an RS(n, k) code, wherein n, k, n', and k' are integers, and k'<n'<n, k'<k<n. The system includes a channel for data transmission, a transmitter for encoding k'-symbol message blocks into n-symbol codewords and transmitting n' symbols of each codeword into the channel, and a receiver for receiving and decoding n'-symbol vectors each corresponding to the n' symbols of one codeword transmitted by the transmitter. The receiver includes a memory device having store therein one erasure locator polynomial $\sigma_0(x)$ and look-up tables, a syndrome calculator for receiving the n'-symbol vectors and for calculating syndromes of each n'-symbol vector, wherein the i-th syndrome $S_i$ of one n'-symbol vector R', $(r_{n'-1}, r_{n'-2}, \ldots, r_0)$, is $S_i = R_s(\alpha^{i+1})$ for i=0, 1, ..., n−k−1, wherein $R_s(x) = r_{n'-1} x^{n'-1} + r_{n'-2} x^{n'-2} + \ldots + r_0$, and means for finding the locations and values of the errors in each n'-symbol vector using the syndromes thereof and the one erasure locator polynomial $\sigma_0(x)$.

Consistent with embodiments of the present invention, there is still provided a method performed by a decoder for decoding an RS(n', k') code modified from an RS(n, k) code, wherein n, k, n', and k' are integers, and k'<n'<n, k'<k<n. The method includes storing one erasure locator polynomial $\sigma_0(x)$ in the decoder, receiving n'-symbol vectors each corresponding to a k'-symbol message block, and decoding the n'-symbol vectors. Furthermore, decoding each n'-symbol vector R', $(r_{n'-1}, r_{n'-2}, \ldots, r_0)$ includes calculating syndromes of R', wherein the i-th syndrome $S_i$ is $S_i = R_s(\alpha^{i+1})$ for i=0, 1, ..., n−k−1, wherein $R_s(x) = r_{n'-1} x^{n'-1} + r_{n'-2} x^{n'-2} + \ldots + r_0$, and finding the locations and values of errors in R' using the syndromes thereof and the one erasure locator polynomial $\sigma_0(x)$.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings,

FIGS. 5A-5B illustrate shortening and puncturing of an RS(n, k) code into an RS(n', k') code;

FIGS. 8A and 8B show a syndrome calculator used in the digital communications system of FIG. 7A;

FIG. 13A shows a Chien search block used in the digital communications system of FIG. 7A;

FIG. 13B shows a Forney algorithm block used in the digital communications system of FIG. 7A; and FIG. 13C shows a calculation cell used in the Chien search block of FIG. 13A and the Forney algorithm block of FIG. 13B.

DESCRIPTION OF THE EMBODIMENTS

Reference will now be made in detail to preferred embodiments of the invention, examples of which are illustrated in the accompanying drawings. Wherever possible, the same reference numbers will be used throughout the drawings to refer to the same or like parts.

Embodiments consistent with the present invention provide a novel hardware implementation of a modified Reed-Solomon decoder for decoding modified RS codes.

In the following, it is assumed that an RS(n, k) code is defined over the Galois Field $GF(2^m)$ and generated by a generator polynomial $$g(x) = \prod_{i=l}^{l+n-k-1} (x - \alpha^i),$$

where l is an offset, and $\alpha$ is the primitive element of $GF(2^m)$ and is a root of an m-degree primitive polynomial f(x). Therefore, $GF(2^m)$ includes 0, $1(=\alpha^0)$, $\alpha^1$, ..., $\alpha^{2^m-2}$. Particularly in the IEEE 802.16a standard, n=255, k=239, r=n-k=16, m=8, l=0, and $$g(x) = \prod_{i=0}^{n-k-1} (x - \alpha^i).$$

It is also assumed that the RS(n, k) code is modified into an RS(n', k') code by shortening the first k-k' symbols thereof and puncturing the last s=r-r' parity symbols, where n'<n, k'<k, k'<n', r=n-k, r'=n'-k'. The shortened k-k' symbols are assumed to be 0's. A receiver receives an n'-symbol vector R', $(r_{n'-1}, r_{n'-2}, \ldots, r_0)$, for each codeword and performs decoding to recover the original k'-symbol message blocks. For example, in the IEEE 802.16a standard, s may be 4, 8, or 12 (see Table 1).

Figure 7A:
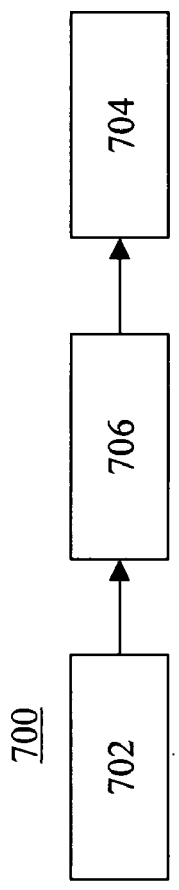
FIG. 7A shows a digital communications system consistent with embodiments of the present invention.

A digital communications system 700 consistent with the present invention is shown in FIG. 7A. System 700 includes an encoder/transmitter 702, a decoder/receiver 704, and a channel 706 therebetween. For each k'-symbol message block, encoder/transmitter 702 generates n-k parity symbols corresponding to a k-symbol sequence including the shortened k-k' symbols (0's) and the k' symbols of the message block, puncturing the last s parity symbols, and transmitting the resultant n'-symbol vector into channel 706.

Figure 7B:
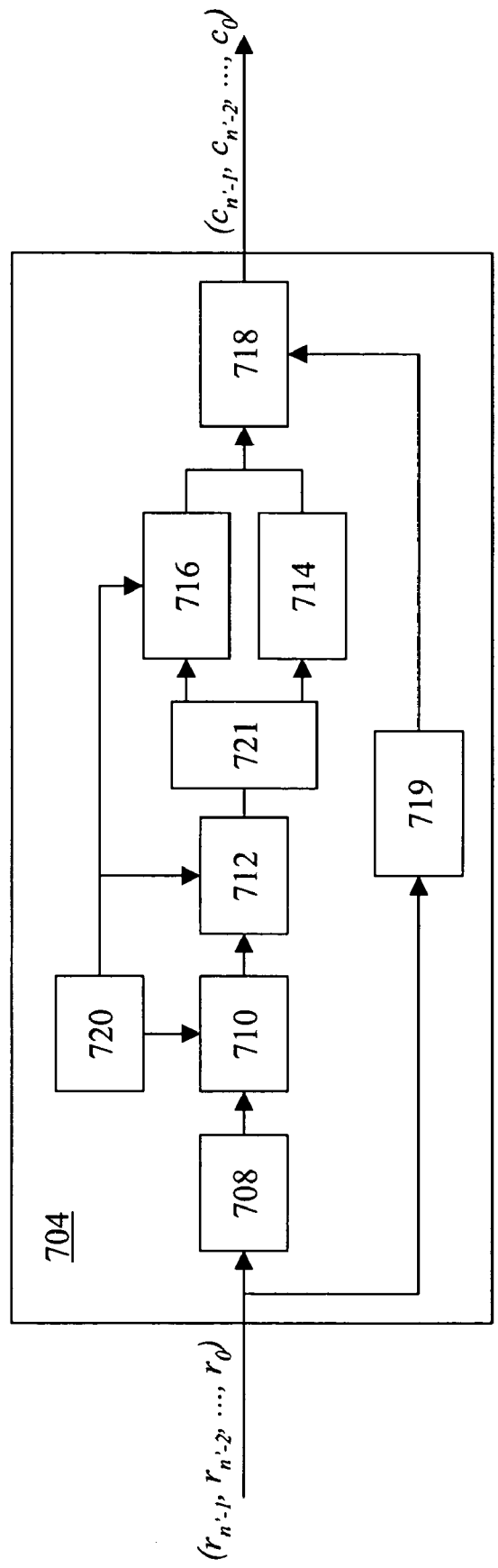
FIG. 7B shows a block diagram of a decoder used in the digital communications system of FIG. 7A.

Decoder/receiver 704 receives a garbled n'-symbol vector and performs decoding to correct errors therein. FIG. 7B shows a block diagram of decoder 704, which receives an n'-symbol vector R', $(r_{n'-1}, r_{n'-2}, \ldots, r_0)$, and outputs the corrected vector C, $(c_{n'-1}, c_{n'-2}, \ldots, c_0)$. Decoder 704 includes a syndrome calculator 708, a modified syndrome calculator 710, a key equation solver 712, a Chien search block 714, a Forney algorithm block 716, and an error correction block 718. Decoder 704 also includes a first-in-first-out (FIFO) buffer 719 that buffers the n' symbols of R', $r_{n'-1}$, $r_{n'-2}$, ... $r_0$, to be corrected in error correction block 718. Decoder 704 may further include a memory 720 for storing predetermined data or look-up tables. Also, as shown in FIG. 7B, decoder 704 includes an index adjustment circuit 721 for adjusting the index of the n' symbols. The details of each part of decoder 704 and the decoding process are discussed below.

Figure 1:
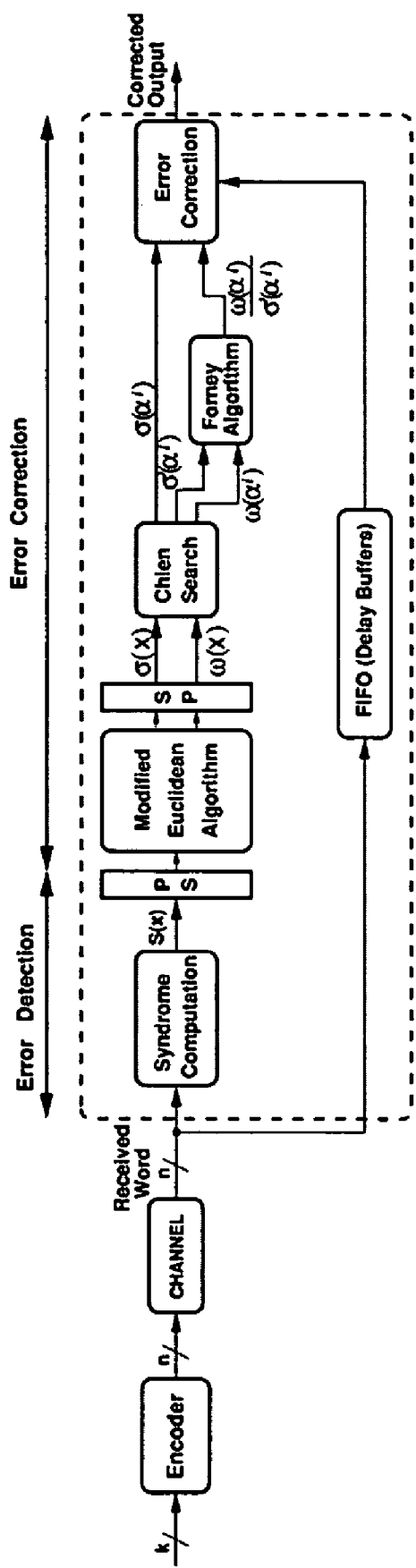
FIG. 1 shows a conventional digital communications system, a decoder of the system including a syndrome computation block, a modified Euclidean (ME) algorithm block, a Chien search block, and a Forney algorithm block.
Figure 2B:
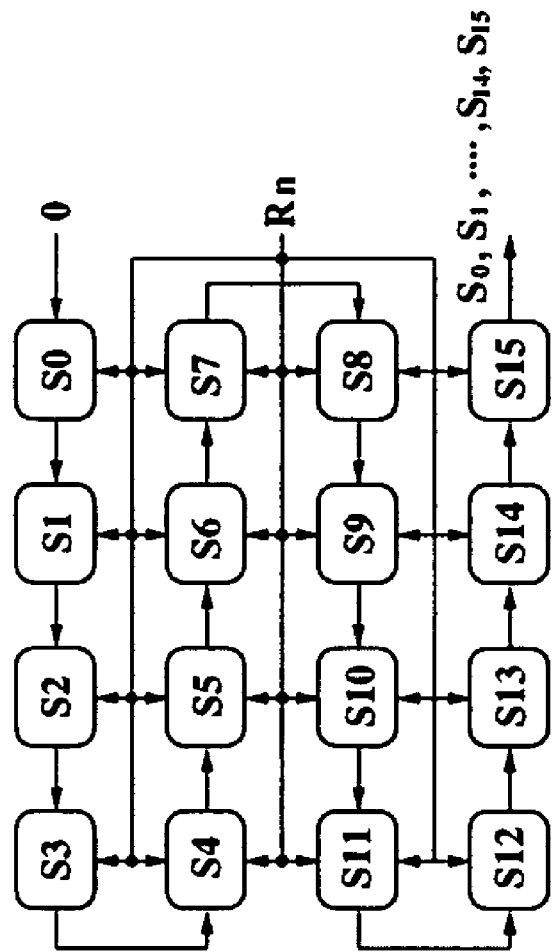
FIGS. 2A and 2B show logic diagrams of the syndrome computation block of FIG. 1.
Figure 2A:
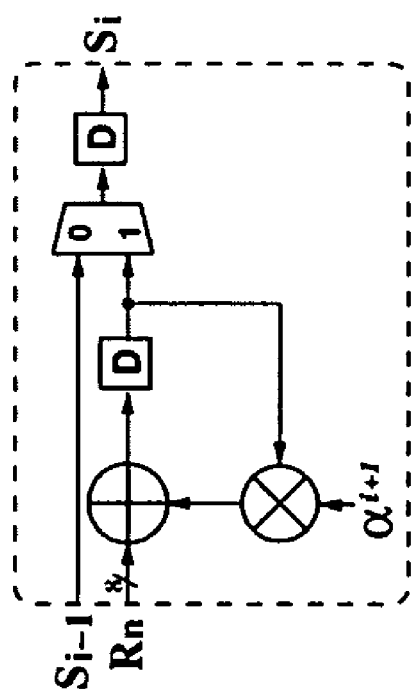
Figure 3A:
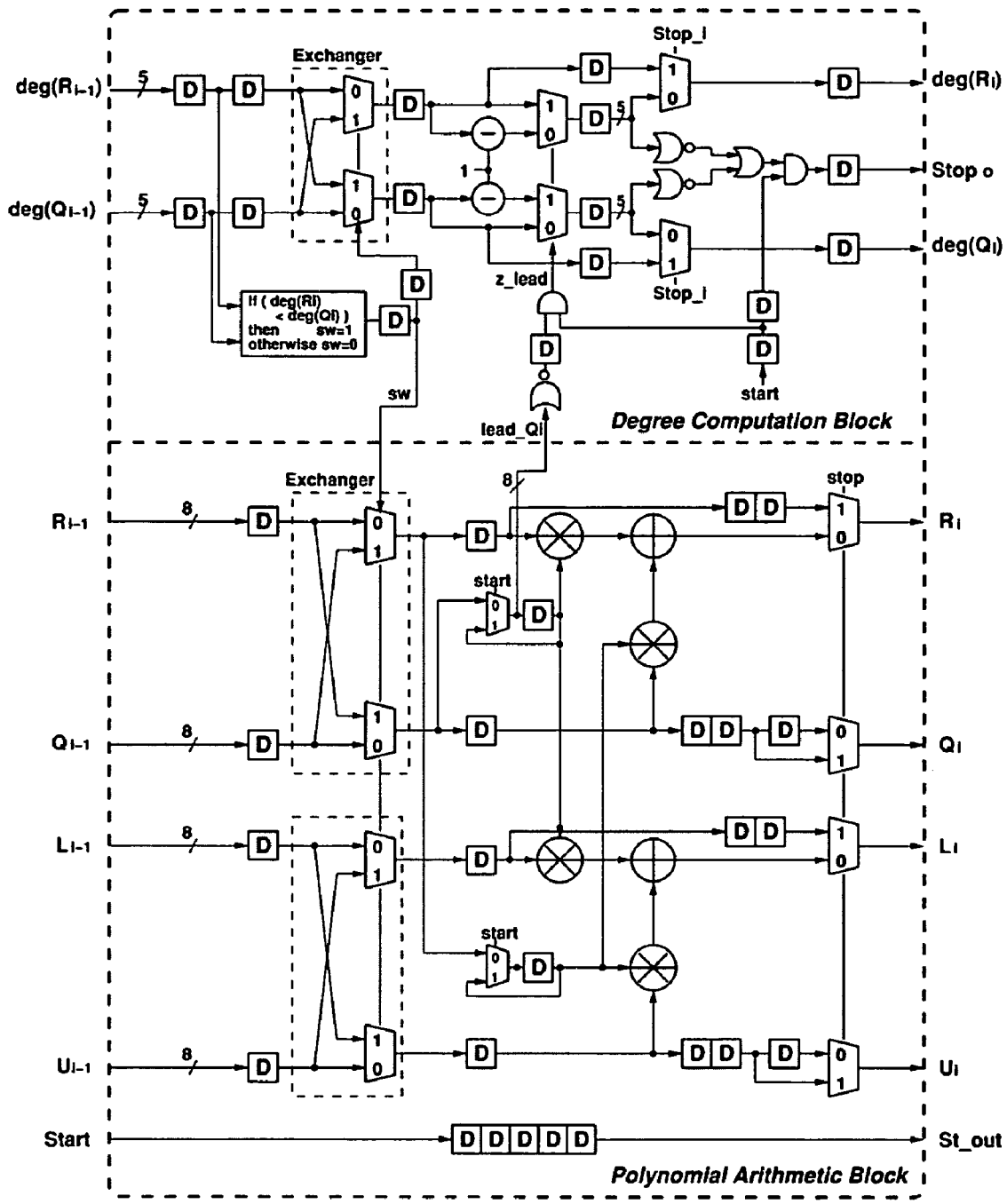
FIGS. 3A and 3B show logic diagrams of the ME algorithm block of FIG. 1.
Figure 3B:
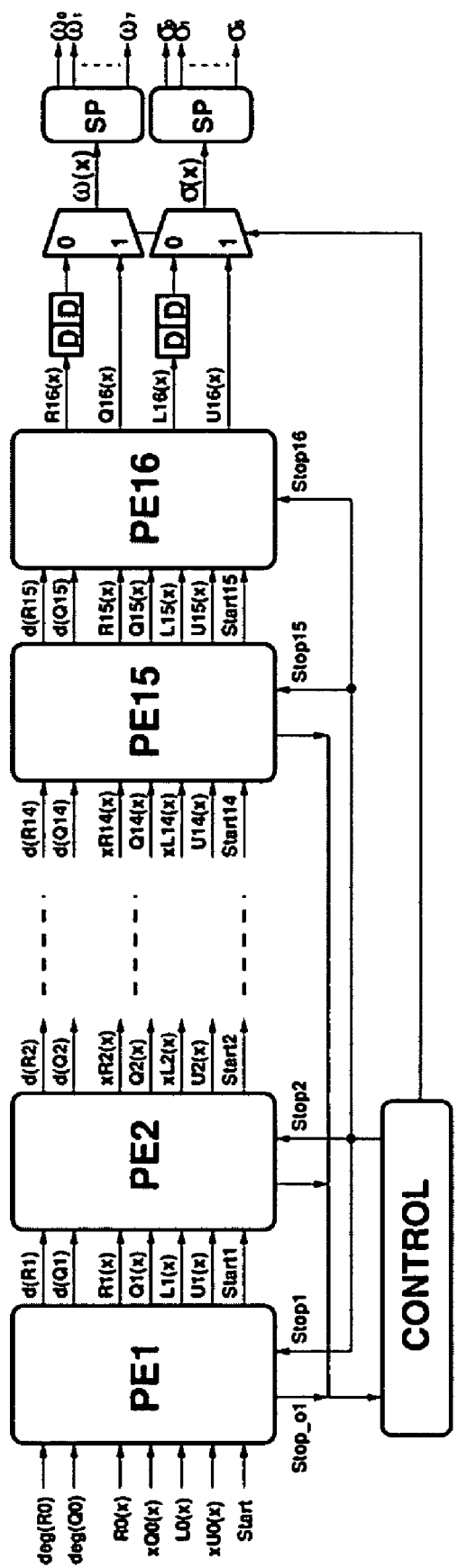
Figure 4B:
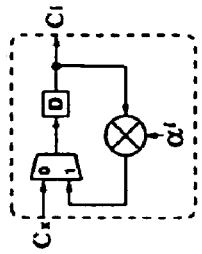
FIGS. 4A-4B show logic diagrams of the Chien search block of FIG. 1.
Figure 4A:
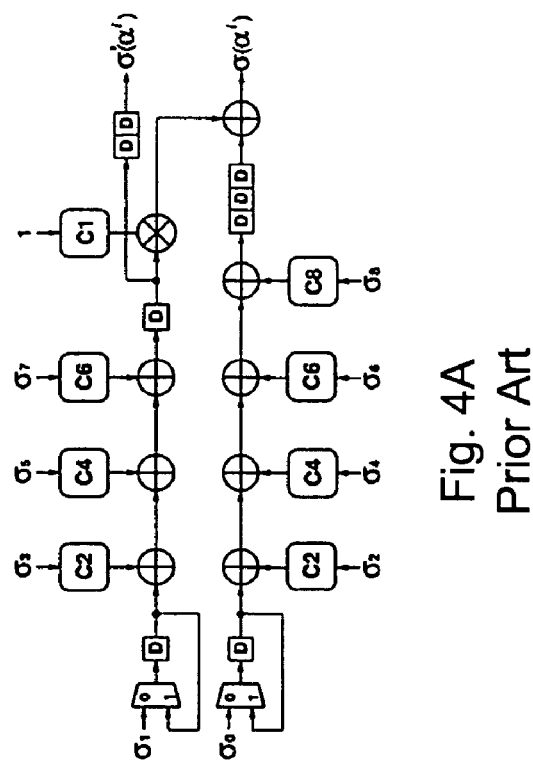
Figure 4C:
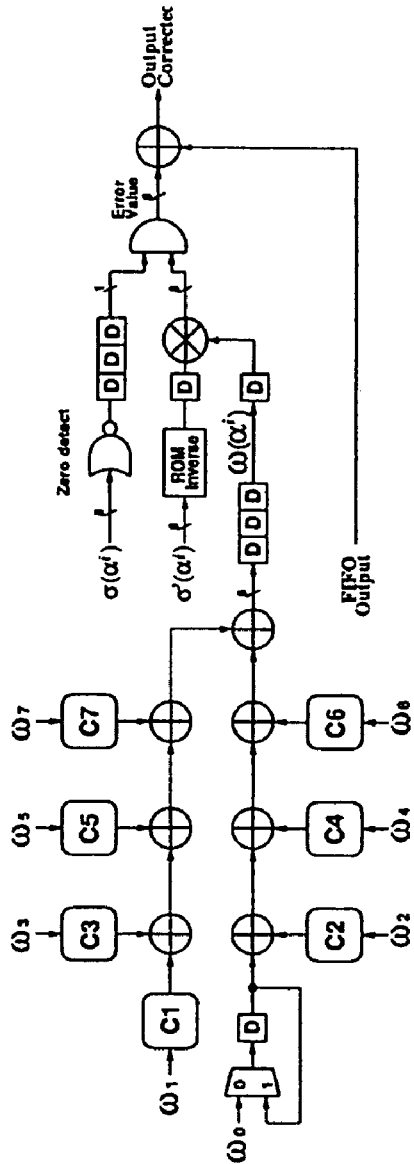
FIG. 4C shows a logic diagram of the Forney algorithm block of FIG. 1.
Figure 6:
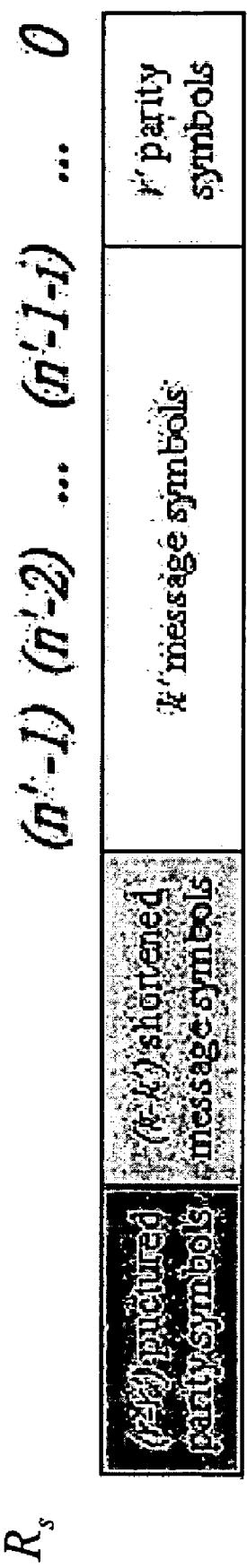
FIG. 6 illustrates the formation of a shifted vector consistent with embodiments of the present invention.

To find the errors in n'-symbol vector R', a corresponding n-symbol vector R is constructed by adding k-k' 0's to the beginning of R', and adding the s punctured parity symbols to the end of R'. For convenience, the s punctured parity symbols are assumed to be 0. Thus, the n symbols of R are 0, 0, ..., 0, $r_{n'-1}, r_{n'-2}, \ldots, r_0, 0, 0, \ldots, 0$, where there are k-k' 0's before $r_{n'-1}$ and s 0's following $r_0$. A shifted vector $R_s$ may be formed by shifting the erased (or punctured) s parity symbols of R to the beginning of R, as shown in FIG. 6. Thus, $R_s$ includes n symbols, i.e., k-k'+s 0's representing both the erased parity symbols and the shortened message symbols, followed by $r_{n'-1}, r_{n'-2}, \ldots, r_0$. Because RS codes are cyclic, if R is a valid codeword, then $R_s$ is also a valid codeword. Therefore, the errors in the n'-symbol vector R', $(r_{n'-1}, r_{n'-2}, \ldots, r_0)$, may be corrected by decoding $R_s$, and decoder 704 operates to decode $R_s$ instead of R.

First, syndromes of $R_s$ are calculated: $S_i = R_s(\alpha^{i+1})$ for i=0, 1, ..., n−k−1. Because the first n−n' symbols of $R_s$ are 0's, $R_s(x) = r_{n'-1}x^{n'-1} + r_{n'-2}x'^{-2} + \ldots + r_0$. Therefore, the calculation of the syndromes of $R_s$ may be carried out based solely on the received n' symbols of R'. Because each R' corresponds to a particular $R_s$, syndromes of $R_s$ are also called the syndromes of R' for convenience of illustration. FIGS. 8A and 8B show details of syndrome calculator 708 consistent with the present invention, where FIG. 8A is a block diagram of syndrome calculator 708 including n−k syndrome calculation cells 722 (722-0, 722-1, ..., 722-(n−k)) and 16 registers 724 (724-0, 724-1, ..., 724-(n−k)), and FIG. 8B is a block diagram of the i-th syndrome calculation cell 722-i, for i=0~(n−k). As shown in FIGS. 8A and 8B, syndrome calculator 708 takes as input the n' symbols of R' and, upon an enable signal ("OE"), serially outputs $(S_{n-k-1}, S_{n-k-2}, \ldots, S_0)$. Each syndrome calculation cell 722-i calculates a corresponding syndrome $S_i$ of $R_s$. The results of syndrome calculation cells 722 are stored in registers 724. As compared to the decoder of Lee, which requires the reception of n symbols, the decoder consistent with the present invention only requires the n' symbols of R' for the calculation of the syndromes. Accordingly, the number of clock cycles required by the syndrome calculator consistent with the present invention is n' instead of n.

Next, modified syndrome polynomial $S_0(x)$ is computed: $S_0(x) = S(x)\sigma_0(x)$, where $$\sigma_0(x) = (1 - \alpha^{n-s}x)(1 - \alpha^{n-(s-1)}x) \ldots (1 - \alpha^{n-1}x) = \sum_{i=0}^{s}\sigma_{0,i}x^i.$$

Figure 9:
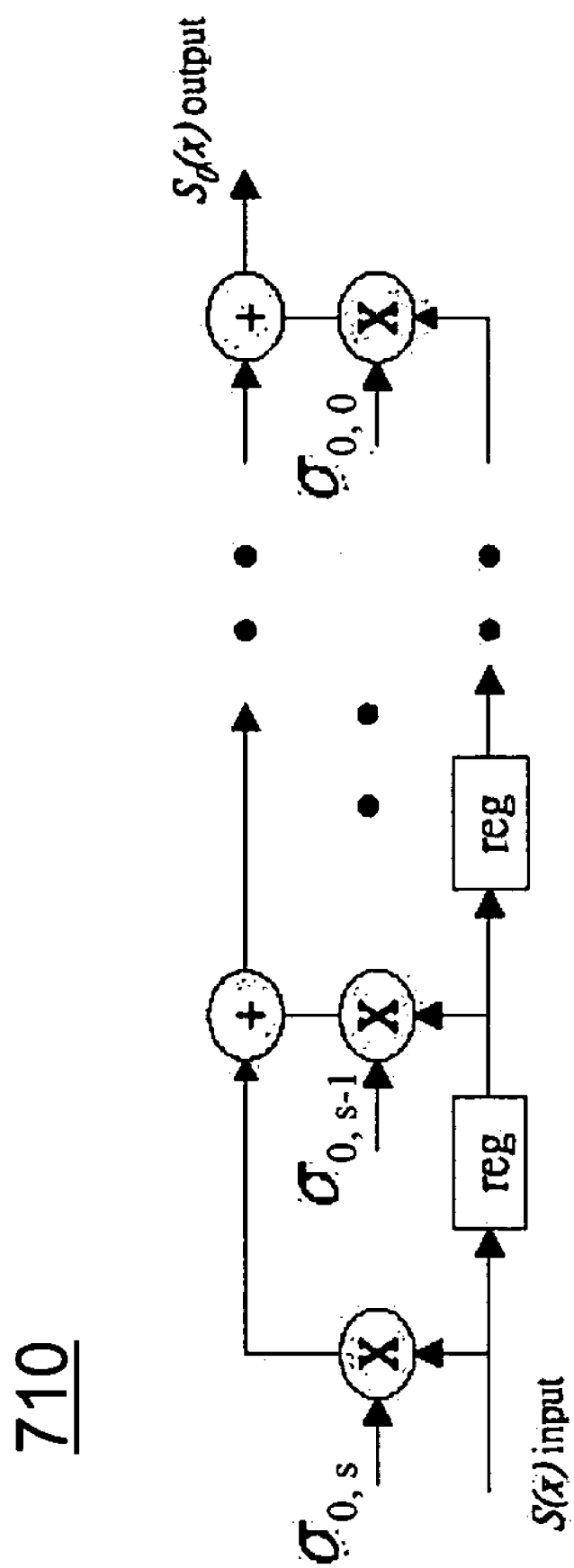
FIG. 9 shows a modified syndrome calculator used in the digital communications system of FIG. 7A.

FIG. 9 is a block diagram of modified syndrome calculator 710 for calculating modified syndrome polynomial $S_0(x)$, which will now be understood by one skilled in the art and is not discussed in detail. The calculation of $\sigma_0(x)$ does not require any data and may be stored in memory 720 of decoder 704. A decoder consistent with embodiments of the present invention may be suitable to decode a plurality of modified RS codes each corresponding to an erasure locator polynomial, in which case the decoder may store the erasure locator polynomials for all of the plurality of modified RS codes. When a particular RS(n', k') code is used, a corresponding erasure locator polynomial $\sigma_0(x)$ is chosen from the stored erasure locator polynomials. For example, a decoder for decoding the six standard shortened/punctured RS codes of the IEEE 802.16a standard may store erasure locator polynomials $\sigma_0(x)$ for all three possible s values of 4, 8, 12.

Assume R' includes t errors at positions $j_1, j_2, \ldots, j_t$, then $R_s$ includes t errors and s erasures, where the s erasures occur at positions $j_{t+1} = n-s, J_{t+2} = n-(s-1), \ldots, j_{t+s} = n$. Assume the error/erasure values are $e_1, e_2, \ldots, e_{t+s}$, where $e_i = r_{j_i} - c_{j_i}$, for i=1, 2, ..., t+s, then $e(x) = e_1 x^{j_1} + e_2 x^{j_2} + \ldots + e_{t+s} x^{j_{t+s}}$. Let $$\beta_i = \alpha^{j_i},$$

for i = 1, 2, ..., t + s, then $S_i = e(\alpha^{i+1}) = \sum_{j=1}^{t+s} e_j \beta_j^i$, for i = 0, 1, ..., n − k − 1.

The key equation is:

$$S(x)\sigma(x) = \omega(x) \mod x^{n-k}, \quad (21)$$

where $$S(x) = \sum_{i=0}^{n-k-1} S_i x^i, \sigma(x) = \prod_{i=1}^{t+s}(1 - \beta_i x) = \sum_{i=0}^{t+s}\sigma_i x^i, \text{ and}$$

$$\omega(x) = \sum_{j=1}^{t+s} e_j \beta_j \prod_{\substack{i=1 \\ i \neq j}}^{t+s}(\beta_i x - 1) = \sum_{i=0}^{t+s-1}\omega_i x^i.$$

$\sigma(x)$ may be further expressed as a product of the erasure locator polynomial $\sigma_0(x)$ and the error locator polynomial $\sigma_1(x)$, i.e., $$\sigma(x) = \sigma_0(x)\sigma_1(x), \text{ where } \sigma_1(x) = \prod_{i=1}^{t}(1 - \beta_i x).$$

The modified key equation is:

$$S_0(x)\sigma_1(x) = \omega(x) \mod x^{n-k}. \quad (22)$$

The modified key equation (22) may be solved using any suitable algorithm such as Berlekamp-Massey algorithm or modified Euclidean algorithm, etc. For example, the modified Euclidean (ME) algorithm of Lee may be further modified ("further modified Euclidean algorithm") consistent with embodiments of the present invention for a more efficient and compact hardware implementation. The further modified Euclidean algorithm is partly illustrated in FIGS. 10A and 10B and is carried out as follows:

1. Initialization: Let $A(x) = x^{n-k}$, $B(x) = S_0(x)$, $T_0(x) = 0$, $T_1(x) = 1$, stopping degree $v = \lfloor (n'-k')/2 \rfloor$;
2. Division:
   i. Calculate $Q = A_{deg\ A(x)}/B_{deg\ B(x)} = A_{deg\ A(x)}(B_{deg\ B(x)})^{-1}$ (FIG. 10A, 10), where $A_{deg\ A(x)}$ and $B_{deg\ B(x)}$ are the terms of A(x) and B(x) with the highest degrees, respectively. The inversion of $B_{deg\ B(x)}$, $(B_{deg\ B(x)})^{-1}$, may be carried out by looking up a table (FIG. 10A, 12), where the table may be stored in memory 720;
   ii. $B_{new}(x) = A(x) - Q \times B(x)$ (FIG. 10A, 14);
3. Multiplication: $T_{new}(x) = T_0(x) - Q \times T_1(x)$ (FIG. 10B, 16);
4. Stopping criteria:
   i. If deg $T_{new}(x) \leq v$ (FIG. 10B, 18), then set $\sigma_1(x) = T_{new}(x)$ (FIG. 10B, 20), $\omega(x) = B_{new}(x)$ (FIG. 10A, 22), and exit;
   ii. Otherwise, set $A(x) = B(x)$ (FIG. 10A, 24), $B(x) = B_{new}(x)$ (FIG. 10A, 26), $T_0(x) = T_1(x)$ (FIG. 10B, 28), $T_1(x) = T_{new}(x)$ (FIG. 10B, 30), go to step 2 and repeat.

Figure 10B:
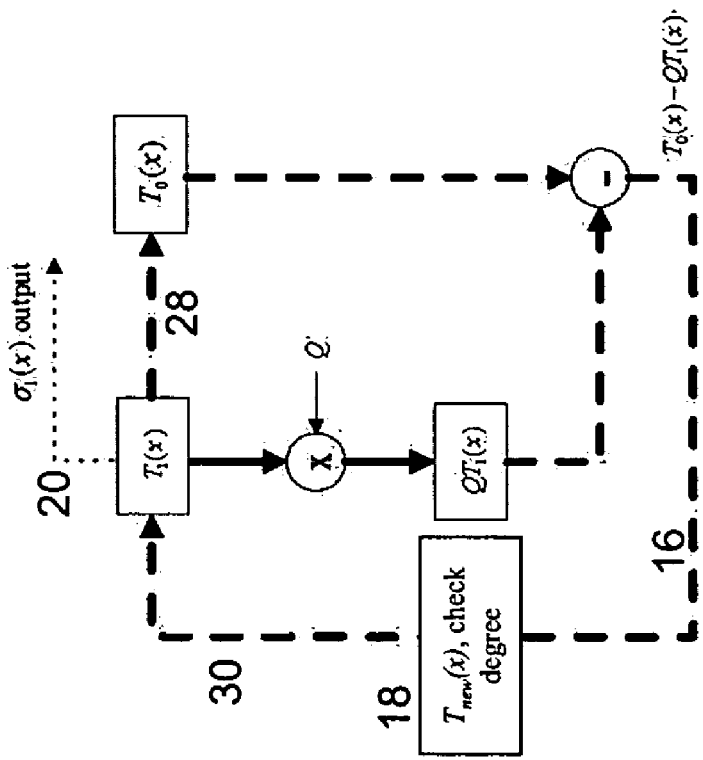
FIGS. 10A and 10B illustrate a further modified Euclidean algorithm consistent with embodiments of the present invention.
Figure 10A:
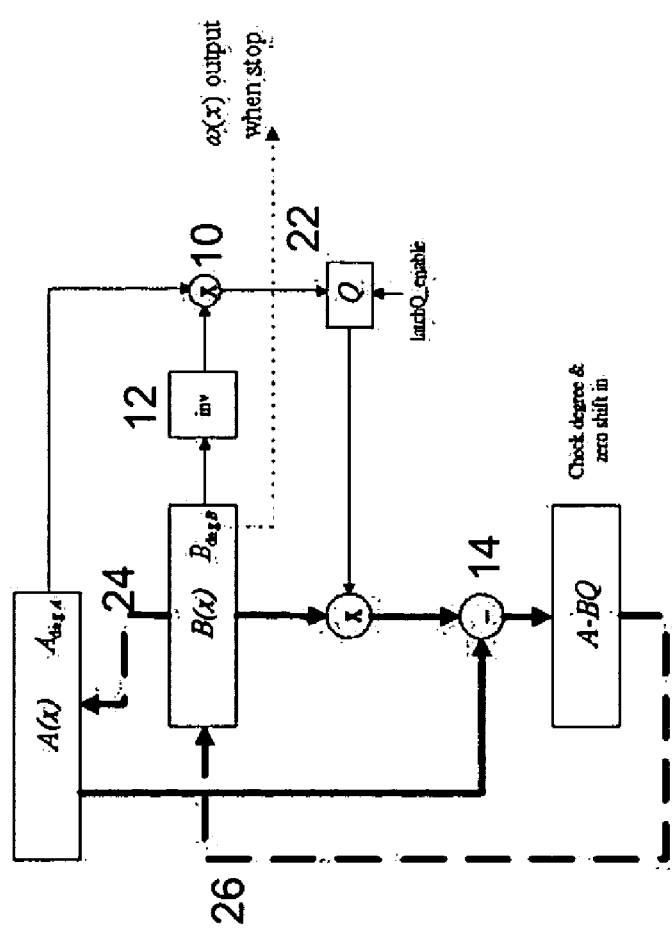
Figure 11:
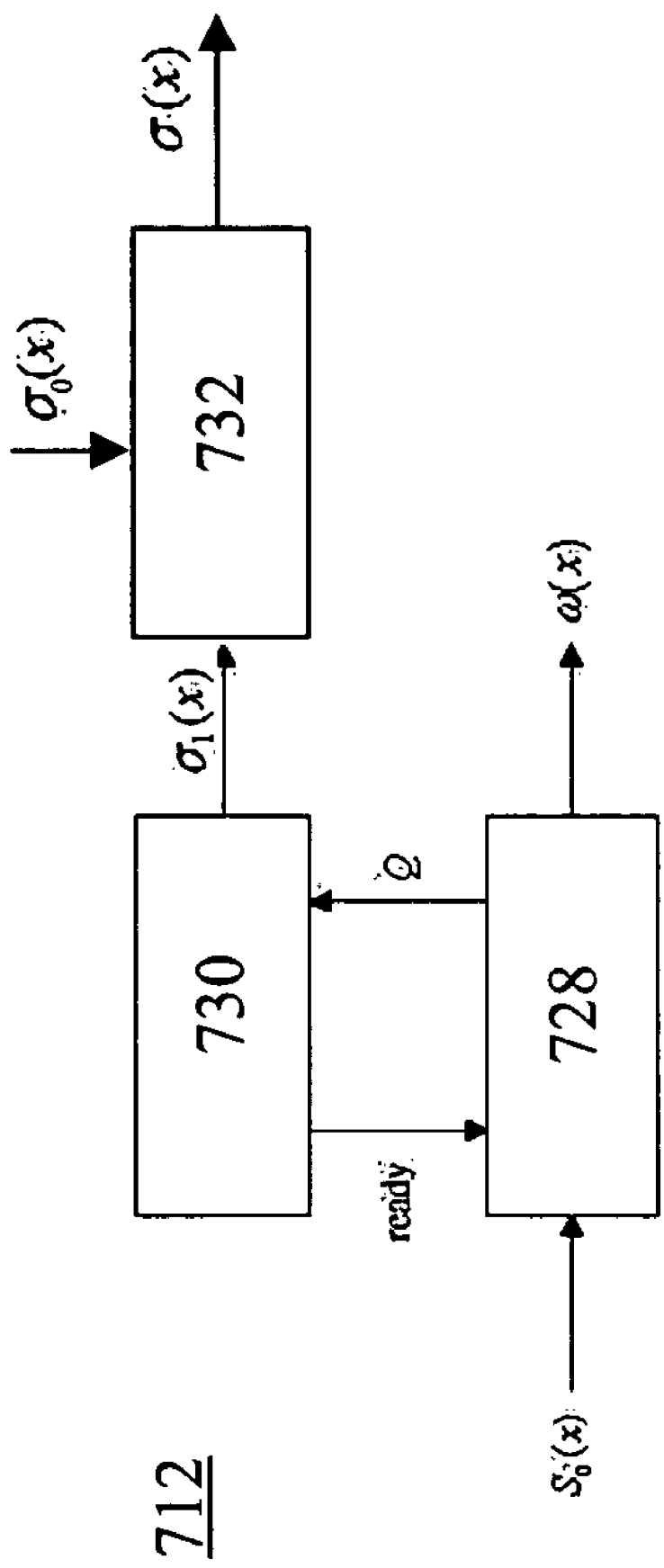
FIG. 11 shows a modified Euclidean processor used in the digital communications system of FIG. 7A.

Thus, as shown in FIG. 11, key equation solver 712 implementing the further modified Euclidean algorithm may include a modified Euclidean divider 728 for performing the steps illustrated in FIG. 10A and a modified Euclidean multiplier 730 for performing the steps illustrated in FIG. 10B above. As shown in FIG. 11, key equation solver 712 receives modified syndrome polynomial $S_0(x)$ as input and outputs error/erasure evaluator polynomial $\omega(x)$ at the output of modified Euclidean divider 728. Modified Euclidean multiplier 730 outputs error-locator polynomial $\sigma_1(x)$. Key equation solver 712 further includes an error/erasure locator polynomial calculator 732 which multiplies error-locator polynomial $\sigma_1(x)$ with erasure-locator polynomial $\sigma_0(x)$ to generate error/erasure locator polynomial $\sigma(x)$.

Figure 12:
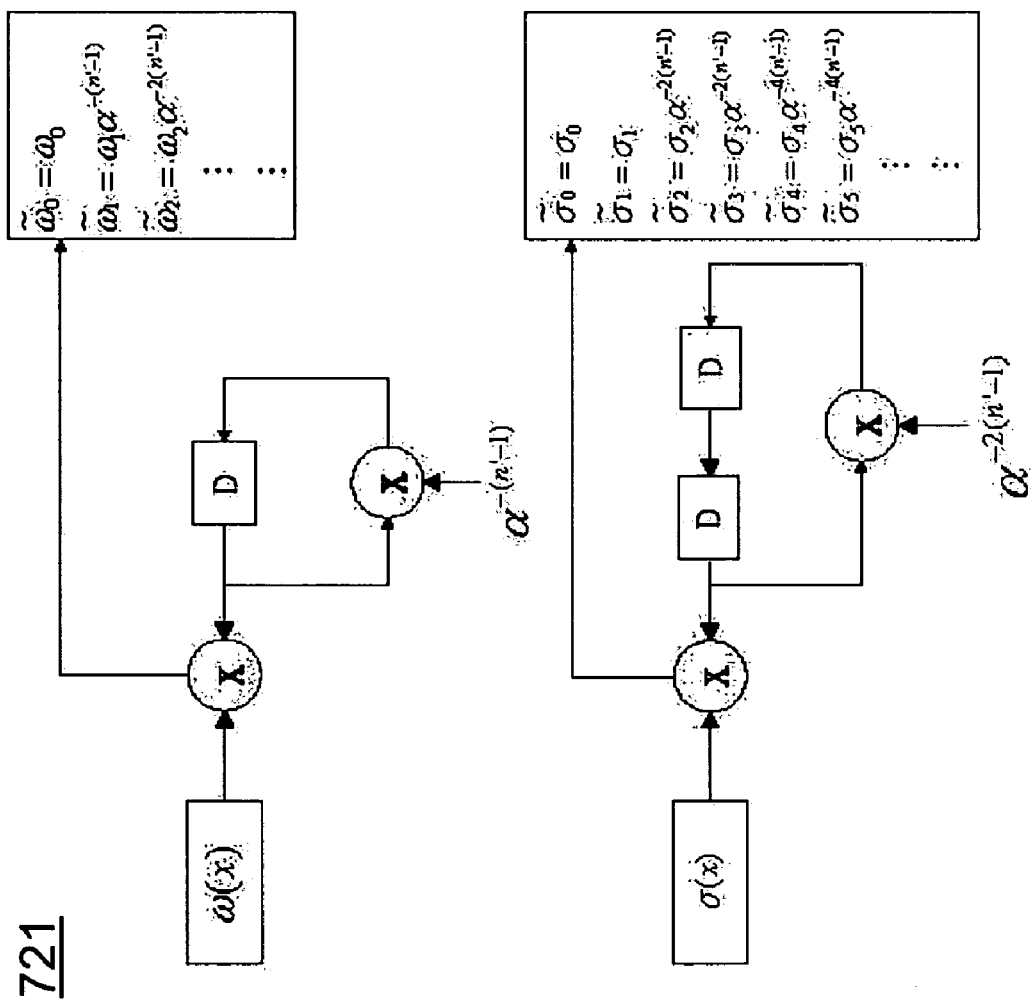
FIG. 12 shows an index adjustment circuit used in the digital communications system of FIG. 7A.

The coefficients of error/erasure locator polynomial σ(x), $\sigma_0, \sigma_1, \ldots, \sigma_{t+s}$, and the coefficients of error/erasure evaluator polynomial ω(x), $\omega_0, \omega_1, \ldots, \omega_{t+s-1}$, are sent to index adjustment circuit 721 for index adjustment. FIG. 12 is a block diagram of index adjustment circuit 721, which receives as input σ(x) and ω(x) and generates an adjusted error/erasure locator polynomial $\tilde{\sigma}(x)$ and an adjusted error/erasure evaluator polynomial $\tilde{\omega}(x)$, where $$\tilde{\sigma}(x) = \sum_{i=0}^{t+s} \tilde{\sigma}_i x^i,$$

$$\tilde{\sigma}_i = \begin{cases} \sigma_i \alpha^{-i(n'-1)}, & \text{for even } i \\ \sigma_i \alpha^{-(i-1)(n'-1)}, & \text{for odd } i \end{cases},$$

$$\tilde{\omega}(x) = \sum_{i=0}^{t+s-1} \tilde{\omega}_i x^i, \text{ and}$$

$$\tilde{\omega}_i = \omega_i \alpha^{-i(n'-1)}.$$

The coefficients of adjusted error/erasure locator polynomial $\tilde{\sigma}(x)$, $\tilde{\sigma}_0, \tilde{\sigma}_1, \ldots, \tilde{\sigma}_{t+s}$, and the coefficients of adjusted error/erasure evaluator polynomial $\tilde{\omega}(x)$, $\tilde{\omega}_0, \tilde{\omega}_1, \ldots, \tilde{\omega}_{t+s-1}$, are sent to Chien search block 714 and Forney algorithm block 716 for determining the error locations and the error/erasure values. FIG. 13A is a logic diagram of Chien search block 714 including a number of calculation cells, each labeled as $C_i$, where i may be any integer from 0 to t+s. FIG. 13B shows a logic diagram of Forney algorithm block 716 also including a number of calculation cells $C_i$. FIG. 13C shows the logic diagram of calculation cell $C_i$ used in FIGS. 13A and 13B. It is assumed that t+s=14 in FIGS. 13A-13C. As shown in FIG. 13A, Chien search block 714 receives the coefficients of $\tilde{\sigma}(x)$, $\tilde{\sigma}_0, \tilde{\sigma}_1, \ldots, \tilde{\sigma}_{t+s}$, and simultaneously calculates $\tilde{\sigma}(x)$ and $\tilde{\sigma}'(x)$ for $x = \alpha^0, \alpha^1, \ldots, \alpha^{n'-1}$. Particularly, $$\tilde{\sigma}'(\alpha^j) = \sum_{j=0}^{\lfloor \frac{t+s-1}{2} \rfloor} \tilde{\sigma}_{2j+1} \alpha^{2j \cdot i}$$

$$= \sum_{j=0}^{\lfloor \frac{t+s-1}{2} \rfloor} \sigma_{2j+1} \alpha^{-2j(n'-1-i)}$$

$$= \sigma'\left(\alpha^{-(n'-1-i)}\right),$$

and $$\tilde{\sigma}'(\alpha^i) = \sum_{j=0}^{\lfloor \frac{t+s}{2} \rfloor} \tilde{\sigma}_{2j} \alpha^{2j \cdot i} + \alpha^{-(n'-1-i)} \sigma'\left(\alpha^{-(n'-1-i)}\right)$$

$$= \sigma'\left(\alpha^{-(n'-1-i)}\right).$$

As shown in FIG. 13B, Forney algorithm block 716 receives the coefficients of $\tilde{\omega}(x)$, $\tilde{\omega}_0, \tilde{\omega}_1, \ldots, \tilde{\omega}_{t+s-1}$ and calculates $\tilde{\omega}(x)$ for $x = \alpha^0, \alpha^1, \ldots, \alpha^{n'-1}$. Particularly, $$\tilde{\omega}(\alpha^i) = \sum_{j=0}^{t+s} \tilde{\omega}_j \alpha^{j \cdot i}$$

$$= \sum_{j=0}^{t+s} \omega_j \alpha^{-j(n'-1-i)}$$

$$= \omega\left(\alpha^{-(n'-1-i)}\right).$$

Further as shown in FIG. 13B, if $\tilde{\sigma}(\alpha^{-i}) \neq 0$, there is no error at position i. If $\tilde{\sigma}(\alpha^{-i})=0$, $$\tilde{e}_i = \frac{-\alpha^{(n'-1)} \alpha^i \tilde{\omega}(\alpha^i)}{\tilde{\sigma}'(\alpha^i)}$$

$$= \frac{-\alpha^{(n'-1-i)} \omega\left(\alpha^{-(n'-1-i)}\right)}{\sigma'\left(\alpha^{-(n'-1-i)}\right)}.$$

Therefore, the error/erasure values determined by Forney algorithm block 716 of FIG. 13B are $\tilde{e}_i = e_{n'-1-i}$. Because error values $\tilde{e}_i$ are computed in the order from $\tilde{e}_0$ to $\tilde{e}_{n'-1}$, the actual error values $e_i$ are computed and outputted in the order from $e_{n'-1}$ to $e_0$. In other words, the order in which the error values are output is the same as the order in which the corresponding symbols are received from FIFO buffer 719. Thus, the index adjustment discussed above and shown in FIG. 12 facilitates the correction of the symbols of R' without the need of reversing the calculated error values $e_i$.

When an RS(n', k') is used, where s parity symbols are punctured, the s erased parity symbols do not have to be corrected because they do not contain message symbols. Thus, as shown in FIGS. 13A and 13B, the decoder consistent with the present invention only needs to identify the errors in the received n' symbols of R', and Chien search block 714 and Forney algorithm block 716 only need to evaluate $\tilde{\sigma}(x)$ and $\tilde{\omega}(x)$ for $x = \alpha^0, \alpha^1, \ldots, \alpha^{n'-1}$. Accordingly, Chien search block 714 and Forney algorithm block 716 of the present invention only requires five clock cycles, which is less than required by conventional RS(n, k) decoders.

Moreover, the syndrome calculator 708 requires only n' clock cycles, and the modified Euclidean divider 728 of the present invention requires only three clock cycles, both fewer than required by conventional RS(n, k) decoders. The total number of clock cycles required by key equation solver 712 consistent with the present invention requires much fewer clock cycles than that required by conventional RS(n, k) decoders. For example, when RS(120, 108) code of the IEEE 802.16a standard is used, the overall decoding process consistent with the present invention requires only about 250 clock cycles.

In addition, embodiments consistent with the present invention provide for a less complex circuit design. Particularly, fewer logic gates are needed by the present invention than by conventional decoders.

In the above descriptions, a shifted vector $R_s$ is formed for each n'-symbol vector R' for the convenience of illustration. However, it is to be understood that the shift of R to generate $R_s$ does not need to be realized in hardware, as is clear from the detailed discussions of decoder 704 in the above. A decoder consistent with the present invention treats the n' symbols of vector R' as the last n' symbols of an n-symbol vector, assumes the first n−n' symbols of the vector to be 0, and decodes the n-symbol vector to identify the errors therein.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A decoder suitable for use in a digital communications system utilizing an RS(n', k') code modified from an RS(n, k) code, wherein the decoder receives n'-symbol vectors each including k' message symbols and r'=n'−k' parity symbols and decodes the n'-symbol vectors to correct errors therein, wherein n, k, n', and k' are integers, and k'<n'<n, k'<k <n, and wherein the decoder stores one erasure locator polynomial $\sigma_0(x)$, the decoder comprising:
   a syndrome calculator for receiving the n'-symbol vectors and for calculating syndromes of each n'-symbol vector, wherein the i-th syndrome $S_i$ of one n'-symbol vector R', $(r_{n'-1}, r_{n'-2}, \ldots, r_0)$, is $S_i = R_s(\alpha^{i+1})$ for i=0, 1, ..., n−k−1, wherein $R_s(x) = r_{n'-1}x^{n'-1} + r_{n'-2}x^{n'-2} + \ldots + r_0$;
   an index adjustment circuit for generating an adjusted error/erasure locator polynomial $\tilde{\sigma}(x)$ and an adjusted error/erasure evaluator polynomial $\tilde{\omega}(x)$ based on the syndromes calculated by the syndrome calculator;
   a memory device for storing the one erasure locator polynomial $\sigma_0(x)$ and a look-up table; and
   means for finding the locations and values of the errors in each n'-symbol vector based on the adjusted error/erasure locator polynomial $\tilde{\sigma}(x)$ and the adjusted error/erasure evaluator polynomial $\tilde{\omega}(x)$, using the look-up table.

2. The decoder of claim 1, further comprising means for correcting the errors in the received n'-symbol vectors.

3. The decoder of claim 1, wherein the decoder is suitable to decode a plurality of modified RS codes each corresponding to an erasure locator polynomial, the decoder stores the erasure locator polynomials for all of the plurality of modified RS codes, and the one erasure locator polynomial $\tilde{\sigma}_0(x)$ is selected from the stored erasure locator polynomials.

4. The decoder of claim 1, further comprising a modified syndrome calculator for calculating a modified syndrome polynomial $S_0(x)$ based on the syndromes calculated by the syndromes calculator and the one erasure locator polynomial, wherein $$S_0(x) = S(x)\sigma_0(x)$$

and $$S(x) = \sum_{i=1}^{n-k-1} S_i x^i.$$

5. The decoder of claim 4, further comprising a key equation solver for solving a key equation to generate an error/erasure locator polynomial $\sigma(x)$ and an error/erasure evaluator polynomial $\omega(x)$, wherein the key equation is $S_0(x)\sigma_1(x) = \omega(x) \bmod x^{n-k}$, and $\sigma(x) = \sigma_0(x)\sigma_1(x)$, and wherein $\sigma_1(x)$ is an error locator polynomial.

6. The decoder of claim 5, wherein the key equation solver comprises a modified Euclidean algorithm processor (ME processor) including a modified Euclidean divider for computing the error/erasure evaluator polynomial $\omega(x)$, a modified Euclidean multiplier for computing the error locator polynomial $\sigma_1(x)$, and an error/erasure locator polynomial calculator for calculating the error/erasure locator polynomial $\sigma(x)$.

7. The decoder of claim 5, wherein the index adjustment circuit is configured to generate the adjusted error/erasure locator polynomial $\tilde{\sigma}(x)$ and the adjusted error/erasure evaluator polynomial $\tilde{\omega}(x)$ based on the error/erasure locator polynomial $\sigma(x)$ and the error/erasure evaluator polynomial $\omega(x)$.

8. The decoder of claim 7, wherein the means for finding the locations and values of the errors comprises a Chien search block for evaluating the adjusted error/erasure locator polynomial $\tilde{\sigma}(x)$ and $\tilde{\sigma}'(x)$ for $x = \alpha^0, \alpha^1, \ldots, \alpha^{n'-1}$, and a Forney algorithm block for evaluating the adjusted error/erasure evaluator polynomial $\tilde{\omega}(x)$ for $x = \alpha^0, \alpha^1, \ldots, \alpha^{n'-1}$, wherein $\tilde{\sigma}'(x)$ is a derivative of $\sigma(x)$, wherein RS(n', k') and RS(n, k) are defined over a Galois field GF($2^m$), m being an integer, and $\alpha$ is a primitive element of GF($2^m$).

9. The decoder of claim 7, wherein, as a result of the index adjustment circuit, an order in which the errors in each n'-symbol vector are output by the means for finding the locations and values of the errors is the same as an order in which symbols corresponding to the errors appear in the corresponding n'-symbol vector.

10. A digital communications system utilizing an RS(n', k') code modified from an RS(n, k) code, wherein n, k, n', and k' are integers, and k'<n'<n, k'<k <n, comprising:
   a channel for data transmission;
   a transmitter for encoding k'-symbol message blocks into n-symbol codewords and transmitting n'-symbols of each codeword into the channel; and
   a receiver for receiving and decoding n'-symbol vectors each corresponding to the n' symbols of one codeword transmitted by the transmitter, the receiver comprising
      a memory device having stored therein one erasure locator polynomial $\sigma_0(x)$ and look-up tables,
      a syndrome calculator for receiving the n'-symbol vectors and for calculating syndromes of each n'-symbol vector, wherein the i-th syndrome $S_i$ of one n'-symbol vector R', $(r_{n'-1}, r_{n'-2}, \ldots, r_0)$, is $S_i = R_s(\alpha^{i+1})$ for i=0, 1, . . . , n−k−1, wherein $R_s(x) = r_{n'-1}x^{n'-1} + r_{n'-2}x^{n'-2} + \ldots + r_0$, and
      means for finding the locations and values of the errors in each n'-symbol vector using the syndromes thereof and the one erasure locator polynomial $\sigma_0(x)$.

11. The system of claim 10, wherein the encoder encodes each k'-symbol message block by adding k−k' 0's to the beginning of the k' symbols, which results in a k-symbol sequence, generating n−k parity symbols corresponding to the resultant k-symbol sequence, which results in the corresponding n-symbol codeword including the k-symbol sequence followed by the n−k parity symbols, and puncturing the last (n−k)−(n'−k') parity symbols, and wherein the n' symbols of the corresponding codeword transmitted into the channel include the k' symbols of the corresponding message block and the remaining n'−k' parity symbols.

12. The system of claim 10, wherein the system is suitable to use any of a plurality of modified RS codes each corresponding to an erasure locator polynomial, the memory device stores the erasure locator polynomials for all of the plurality of modified RS codes, and the one erasure locator polynomial $\sigma_0(x)$ is selected from the stored erasure locator polynomials.

13. The system of claim 10, wherein the receiver further comprises means for correcting the errors in the received n'-symbol vectors.

14. The system of claim 10, further comprising a modified syndrome calculator for calculating a modified syndrome polynomial $S_0(x)$ based on the syndromes calculated by the syndromes calculator and the one erasure locator polynomial $\sigma_0(x)$, wherein $$S_0(x) = S(x)\sigma_0(x)$$

and $$S(x) = \sum_{i=0}^{n-k-1} S_i x^i.$$

15. The system of claim 14, wherein the receiver further comprises a key equation solver for solving a key equation to generate an error/erasure locator polynomial $\sigma(x)$ and an error/erasure evaluator polynomial $\omega(x)$, wherein the key equation is $S_0(x)\sigma_1(x) = \omega(x) \bmod x^{n-k}$, and $\sigma(x) = \sigma_0(x)\sigma_1(x)$, and wherein $\sigma_1(x)$ is an error locator polynomial, wherein the key equation solver uses one of the look-up tables stored in the memory device.

16. The system of claim 15, wherein the key equation solver comprises a modified Euclidean algorithm processor (ME processor) including a modified Euclidean divider for computing the error/erasure evaluator polynomial $\omega(x)$, a modified Euclidean multiplier for computing the error locator polynomial $\sigma_1(x)$, and an error/erasure locator polynomial calculator for calculating the error/erasure locator polynomial $\sigma(x)$.

17. The system of claim 15, wherein the receiver further comprises an index adjustment circuit for generating an adjusted error/erasure locator polynomial $\tilde{\sigma}(x)$ and an adjusted error/erasure evaluator polynomial $\tilde{\omega}(x)$.

18. The system of claim 17, wherein an order in which the errors in each n'-symbol vector are output by the means for finding the locations and values of the errors is the same as an order in which symbols corresponding to the errors appear in the corresponding n'-symbol vector.

19. The system of claim 17, wherein the means for finding the locations and values of the errors comprises a Chien search block for evaluating the adjusted error/erasure locator polynomial $\tilde{\sigma}(x)$ and $\tilde{\sigma}'(x)$ for $x = \alpha^0, \alpha^1, \ldots, \alpha^{n'-1}$, and a Forney algorithm block for evaluating the adjusted error/erasure evaluator polynomial $\tilde{\omega}(x)$ for $x = \alpha^0, \alpha^1, \ldots, \alpha^{n'-1}$, wherein $\tilde{\sigma}'(x)$ is a derivative of $\sigma(x)$, wherein RS(n', k') and RS(n, k) are defined over a Galois field GF($2^m$), m being an integer, and $\alpha$ is a primitive element of GF($2^m$).

20. A method performed by a decoder for decoding an RS(n', k') code modified from an RS(n, k) code, wherein n, k, n', and k' are integers, and k'<n'<n, k'<k <n, the method comprising:
  storing one erasure locator polynomial $\sigma_0(x)$ in a memory device in the decoder;
  receiving n'-symbol vectors each corresponding to a k'-symbol message block; and
  decoding each n'-symbol vector R', ($r_{n'-1}, r_{n'-2}, \ldots, r_0$), including calculating syndromes of R', wherein the i-th syndrome $S_i$ is $S_i = R_s(\alpha^{i+1})$ for i=0, 1, ..., n-k-1, wherein $R_s(x) = r_{n'-1}x^{n'-1} + r_{n'-2}x^{n'-2} + \ldots + r_0$;
  generating an adjusted error/erasure locator polynomial $\tilde{\sigma}(x)$ and an adjusted error/erasure evaluator polynomial $\tilde{\omega}(x)$ based on the syndromes; and
  finding the locations and values of errors in R' based on the adjusted error/erasure locator polynomial $\tilde{\sigma}(x)$ and the adjusted error/erasure evaluator polynomial $\tilde{\omega}(x)$, using a look-up table stored in the memory device.

21. The method of claim 20, wherein decoding each n'-symbol vector further includes calculating a modified syndrome polynomial $S_0(x)$ based on the syndromes thereof and the one erasure locator polynomial $\sigma_0(x)$, wherein $$S_0(x) = S(x)\sigma_0(x) \text{ and } S(x) = \sum_{i=0}^{n-k-1} S_i x^i.$$

22. The method of claim 20, wherein decoding each n'-symbol vector further includes correcting the errors in the received n'-symbol vectors.

23. The method of claim 20, further comprising storing two additional erasure locator polynomials $\sigma_0(x)$ in the decoder such that the three stored erasure locator polynomials $$\sigma_0(x)$$

are $$\sigma_0(x) = \prod_{i=1}^{s}(1 - \alpha^{255-i}x) = \sum_{i=0}^{s} \sigma_{0,i} x^i,$$

for $$s = 4, 8, \text{ or } 12,$$

wherein RS(n', k') and RS(n, k) are defined over a Galois field GF($2^m$), m being an integer, and $\alpha$ is a primitive element of GF($2^m$), and wherein the one erasure locator polynomial $\sigma_0(x)$ is selected from the three stored erasure locator polynomials $\sigma_0(x)$.

24. The method of claim 20, wherein decoding each n'-symbol vector further includes solving a key equation to generate an error/erasure locator polynomial $\sigma(x)$ and an error/erasure evaluator polynomial $\omega(x)$, wherein the key equation is $S_0(x)\sigma_1(x) = \omega(x) \bmod x^{n-k}$, and $\sigma(x) = \sigma_0(x)\sigma_1(x)$, and wherein $\sigma_1(x)$ is an error locator polynomial.

25. The method of claim 24, wherein decoding each n'-symbol vector further includes adjusting indices of the error/erasure locator polynomial $\sigma(x)$ and the error/erasure evaluator polynomial $\omega(x)$ to generate the adjusted error/erasure locator polynomial $\tilde{\sigma}(x)$ and the adjusted error/erasure evaluator polynomial $\tilde{\omega}(x)$.

26. The method of claim 25, wherein finding the locations and values of the errors includes performing a Chien search to evaluate the adjusted error/erasure locator polynomial $\tilde{\sigma}(x)$ and $\tilde{\sigma}'(x)$ for $x = \alpha^0, \alpha^1, \ldots, \alpha^{n'-1}$, and performing a Forney algorithm to evaluate the adjusted error/erasure evaluator polynomial $\tilde{\omega}(x)$ for $x = \alpha^0, \alpha^1, \ldots, \alpha^{n'-1}$, wherein $\tilde{\sigma}'(x)$ is a derivative of $\sigma(x)$, wherein $RS(n', k')$ and $RS(n, k)$ are defined over a Galois field $GF(2^m)$, m being an integer, and $\alpha$ is a primitive element of $GF(2^m)$.

27. The method of claim 25, wherein finding the locations and values of the errors comprises finding the locations and values of the errors in an order that is the same as an order in which symbols corresponding to the errors appear in the corresponding n'-symbol vector.

* * * * *

UNITED STATES PATENT AND TRADEMARK OFFICE
CERTIFICATE OF CORRECTION

PATENT NO. : 7,539,927 B2
APPLICATION NO. : 11/105420
DATED : May 26, 2009
INVENTOR(S) : Shuenn-Gi Lee et al.

It is certified that error appears in the above-identified patent and that said Letters Patent is hereby corrected as shown below:

In claim 3, column 15, line 45, "$\tilde{\sigma}_0(x)$" should read --$\sigma_0(x)$--.

In claim 4, column 15, lines 58-60, " $S(x) = \sum_{i=1}^{n-k-1} S_i x^i.$ " should read -- $S(x) = \sum_{i=0}^{n-k-1} S_i x^i.$ --.

In claim 8, column 16, line 24, "αis" should read --α is--.

In claim 20, column 17, lines 58-59, delete the line break between "RS(" and "n', k')".

In claim 20, column 17, line 60, "k'are" should read --k' are--.

In claim 20, column 18, line 7, "R'based" should read --R' based--.

Signed and Sealed this

Eighteenth Day of August, 2009

David J. Kappos
*Director of the United States Patent and Trademark Office*